United States Patent
Hsu et al.

(10) Patent No.: US 6,569,777 B1
(45) Date of Patent: May 27, 2003

(54) PLASMA ETCHING METHOD TO FORM DUAL DAMASCENE WITH IMPROVED VIA PROFILE

(75) Inventors: Jyh-Shiou Hsu, Hsin-Chu (TW); Feng-Yueh Chang, Banchiau (TW); Pin-Yi Hsin, Chu-Pei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/263,309

(22) Filed: Oct. 2, 2002

(51) Int. Cl.⁷ .............................................. H01L 21/302
(52) U.S. Cl. ..................... 438/725; 438/714; 438/723; 438/724; 438/734; 438/694; 438/692; 438/704; 134/1.2
(58) Field of Search .................... 134/1.3, 1.2; 438/725, 438/723, 724, 714, 734, 694, 692, 693, 704

(56) References Cited

U.S. PATENT DOCUMENTS 6,057,239 A * 5/2000 Wang et al. ................ 438/689
6,323,121 B1 * 11/2001 Liu et al. .................... 438/633
6,362,093 B1 * 3/2002 Jang et al. .................. 438/633
6,458,705 B1 * 10/2002 Hung et al. ................ 438/692
6,475,905 B1 * 11/2002 Subramanian et al. ...... 438/637
2002/0173160 A1 * 11/2002 Keil et al. .................. 438/717

* cited by examiner

Primary Examiner—G Goudreau
(74) Attorney, Agent, or Firm—Tung & Associates

(57) ABSTRACT

A method for plasma etching a semiconductor feature to improve an etching profile including providing a semiconductor wafer comprising a first feature opening anisotropically etched though a thickness portion of at least one dielectric insulating layer; anisotropically etching a second feature opening overlying and at least partially encompassing the first feature opening according to a reactive ion etch (RIE) process to leave an unetched portion surrounding a first feature opening portion at about a bottom portion level of the second feature opening; and, plasma treating the first and second openings with a plasma formed of a mixture of oxygen and nitrogen plasma source gases including an applying an independently variable RF bias power source to the semiconductor wafer to remove the unetched portion.

20 Claims, 2 Drawing Sheets

PLASMA ETCHING METHOD TO FORM DUAL DAMASCENE WITH IMPROVED VIA PROFILE

FIELD OF THE INVENTION

This invention generally relates to multi-layered semiconductor structures and more particularly to a method for forming a dual damascene structure with improved an improved via profile to improve electrical performance including electromigration resistance and improved metal filling characteristics.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low resistance and capacitance interconnect properties, particularly where submicron inter-layer interconnects and intra-layer interconnects have increasingly high aspect ratios (e.g., an interconnect opening depth to diameter ratio of greater than about 4). In particular, high aspect ratio vias require uniform etching profiles including preventing formation of unetched residues around the via openings during anisotropic etching of an overlying trench structure in a dual damascene formation process. Such residual oxides, also referred to as via fences, detrimentally affect subsequent processes including adhesion/barrier layer deposition and metal filling deposition frequently resulting in degraded device performance including electrical pathway open circuits.

In the fabrication of semiconductor devices, increased device density requires multiple layers, making necessary the provision of a multi-layered interconnect structure. Such a multi-layered interconnect structure typically includes intra-layer conductive interconnects and inter-layer conductive interconnects formed by anisotropically etched openings in an dielectric insulating layer, often referred to as an inter-metal dielectric (IMD) layer, which are subsequently filled with metal. Commonly used inter-layer high aspect ratio openings are commonly referred to as vias, for example, when the opening extends through an insulating layer between two conductive layers. The intra-layer interconnects extending horizontally in the IMD layer to interconnect different areas within an IMD layer are often referred to as trench lines. In one manufacturing approach, trench lines are formed overlying and encompassing one or more vias to form metal inlaid interconnects referred to as dual damascene structures.

In a typical process for forming multiple layer interconnect structure, for example, a dual damascene process, via openings are first anisotropically etched through an IMD layer by conventional photolithographic and etching techniques. A second anisotropically etched opening referred to as a trench line is then formed according to a second photolithographic patterning process overlying and encompassing one or more of the via openings. The via openings and the trench line together makeup the dual damascene structure which is subsequently filled with metal, for example, copper, followed by a CMP planarization process to planarize the wafer process surface and prepare the process surface for formation of another overlying layer or level in a multi-layered semiconductor device.

One approach to increasing signal transport speeds has been to reduce the dielectric constant of the dielectric insulating material used to form IMD layers thereby reducing the capacitance contribution of the IMD layer. Typical low-k (low dielectric constant) materials in use have included carbon doped silicon dioxide and other materials which tend to form a porous material thereby reducing the overall dielectric constant. Porous low-k materials have several drawbacks including enhanced absorption of chemical species by which may easily migrate throughout the IMD layer.

As feature sizes in anisotropic etching process have diminished, photolithographic patterning processes require activating light (radiation) of increasingly smaller wavelength. For 0.25 micron and below CMOS technology, deep ultraviolet (DUV) photoresists have become necessary to achieve the desired resolution. Typically DUV photoresists are activated with activating light source wavelengths of less than about 250 nm, for example, commonly used wavelengths include 193 nm and 248 nm. Many DUV photoresists are chemically amplified using a photoacid generator activated by the light source to make an exposed area soluble in the development process.

One problem affecting the anisotropic etching of dual damascene features, particularly with respect to the trench portion etching process has been thought in the prior art to be related to the use of DUV photoresist processes to pattern the trench portion for etching. For example, photoresist residue also referred to as scum frequently forms on the sidewalls of the via prior to the trench etching process and has been believed to degrade subsequent etching profiles of the completed dual damascene structure. The photoresist residue has been attributed to interference of residual nitrogen-containing species, for example amines, with the DUV photoresist. Residual nitrogen-containing species contamination have been thought to originate from amine containing CVD precursors which are frequently used to deposit nitride etching stop layers and anti-reflectance coating (ARC) layers. Nitrogen containing species are known to interfere with chemically amplified DUV photoresists by neutralizing a photogenerated acid catalyst which thereby renders the contaminated portion of the photoresist insoluble in the developer. Regardless of the precise cause of such photoresist residue, the residue frequently remains on patterned feature edges, sidewalls, or floors of features, detrimentally affecting subsequent anisotropic etching profiles. During anisotropic etching of an overlying feature, for example a trench line opening overlying a via opening, residual photoresist for a trench line patterning step remains on via opening sidewalls. Consequently, during etching of the trench opening upon reaching the via level, uneven etching occurs around the via opening area causing, for example, a via fence of etching resistant material to form around the via opening. Such undesirable etching profiles detrimentally affect subsequent metal filling processes adversely affecting adhesion of overlayers of material and detrimentally affecting electrical performance and device reliability.

There is therefore a need in the semiconductor processing art to develop a method to reliably anisotropically etch dual damascene structures to avoid forming via fences to achieve improved device reliability and electrical performance.

It is therefore an object of the invention to provide a method to reliably anisotropically etch dual damascene structures to avoid forming via fences to achieve improved device reliability and electrical performance while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for plasma etching a semiconductor feature to improve an etching profile.

In a first embodiment, the method includes providing a semiconductor wafer comprising a first feature opening anisotropically etched though a thickness portion of at least one dielectric insulating layer; anisotropically etching a second feature opening overlying and at least partially encompassing the first feature opening according to a reactive ion etch (RIE) process to leave an unetched portion surrounding a first feature opening portion at about a bottom portion level of the second feature opening; and, plasma treating the first and second openings with a plasma formed of a mixture of oxygen and nitrogen plasma source gases including an applying an independently variable RF bias power source to the semiconductor wafer to remove the unetched portion.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Although the method of the present invention is explained by exemplary reference the formation of a via-first method of formation of a dual damascene structure in a multi-level semiconductor device, it will be appreciated that the method of the present invention including particularly the oxygen plasma treatment process is equally applicable to the formation of any semiconductor feature where residual photoresist or polymeric residue remains on features following a photolithographic patterning process and/or an anisotropic etching process where such residue is advantageously removed according to oxygen/nitrogen plasma treatment according to an aspect of the present invention. The method of the present invention is particularly advantageous for, but need not be limited to, the formation of a dual damascene structure, for example a copper filled dual damascene structure formed in a low dielectric constant (low-k) carbon doped silicon oxide insulating layer, defined as having a dielectric constant of less than about 3.2.

Figure 1A:
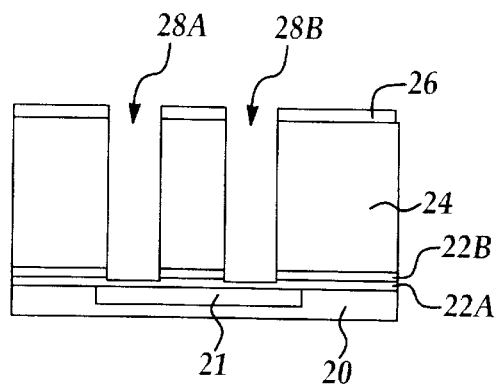
FIGS. 1A–1F are cross sectional views of an exemplary dual damascene structure at stages in a manufacturing process according to an embodiment of the present invention.

For example, in an exemplary embodiment, referring to FIGS. 1A–1F, are shown cross sectional side views of a portion of a multi-level semiconductor device at stages in a dual damascene manufacturing process. Referring to FIG. 1A is shown a conductive region 21, for example, copper, formed in a dielectric insulating layer 20 having an overlying etching stop layer 22A, for example, silicon carbide (e.g., SiC), formed by a conventional chemical vapor deposition (CVD) process including for example, LPCVD (low pressure CVD), having a thickness of about 300 Angstroms to about 700 Angstroms. Overlying the etching stop layer is a silicon dioxide capping layer 22B formed of TEOS (tetra-ethyl-ortho-silicate) precursor according to a conventional plasma enhanced CVD (PECVD) process. Capping layer 229 is formed at a thickness of about 200 to about 400 Angstroms.

Still referring to FIG. 1A, formed over capping layer 22B is formed a dielectric insulating layer 24, also referred to as an inter-metal dielectric (IMD) layer formed of, for example, for example a carbon doped silicon dioxide, also referred to as organo silicate glass (OSG) and C-oxide. Several commercially available formulations are available for producing the low-k carbon doped oxide, for example, known as SILK™ and BLACK DIAMOND™ according to conventional PECVD processes. In addition, the carbon doped oxides may be produced by PECVD methods using organo-silane precursors such as octa-methyl-cyclo-tetra-siloxane and tetra-methyl-cyclo-tetra-siloxane where the dielectric constant may be varied over a range depending on the precursors and process conditions. C-oxides, for example, may be formed with dielectric constants over a range of about 2.0 to about 3.0 having a density of about 1.3 g/cm$^3$. Typically, the IMD layer is formed having a thickness of about 6000 to about 8000 Angstroms.

Still referring to FIG. 1A, following deposition of the IMD layer 24, an etching stop/ARC layer 26, for example a single layer formed of, for example, silicon oxynitride (e.g., SiON), functioning as both an etching stop and an anti-reflectance coating (ARC) layer by an LPCVD process, having a thickness of about 1000 Angstroms to about 1400 Angstroms. It will be appreciated that an etching stop layer and ARC layer may be formed separately, for example including silicon nitride (SiN) etching stop layer and an overlying SiON ARC layer. The ARC layer is also referred to as bottom anti-reflectance coating (BARC) and is formed to reduce undesired light reflections from the IMD layer or etching stop layer surface during a photolithographic patterning process. It will be appreciated that according to the exemplary embodiment of the present invention including etching processes outlined below, that the anisotropic etching processes are optimized and critical for etching a silicon oxynitride (e.g., SiON) stop/ARC layer. In addition it will be appreciated that according to the exemplary embodiment of the present invention including etching processes outlined below, that the anisotropic etching processes are optimized and critical for etching a carbon doped oxide IMD layer.

Referring to FIG. 1A, via etching patterns are first formed according to a conventional photolithographic patterning process followed by a conventional reactive ion etching (RIE) step to form via openings e.g., 28A and 28B. For example the anisotropic etching step includes sequential etching steps including conventional plasma etching chemistries formed of combinations of gases including hydrofluorocarbons, fluorocarbons, nitrogen, and oxygen to sequentially etch through a thickness of the etch stop/ARC layer 26, the IMD layer 24, the capping layer 22B and partially through a thickness of the first etch stop layer 22A.

Figure 1B:
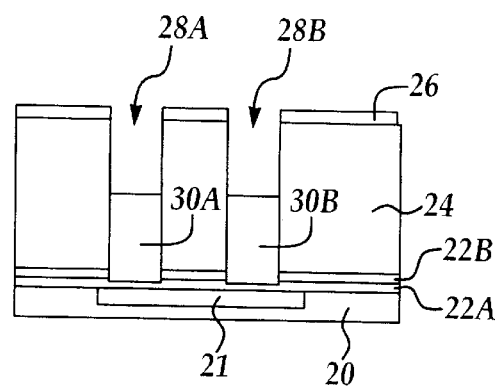
Figure 1C:
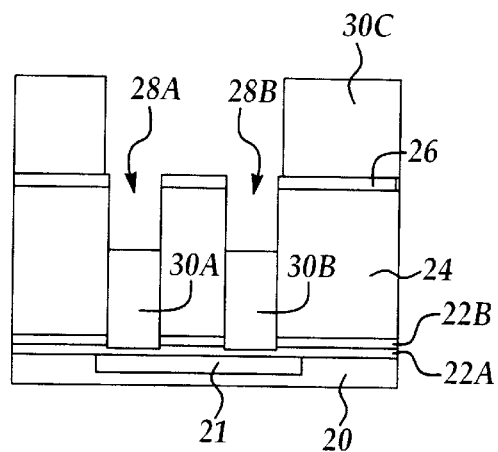

Referring to FIG. 1B, following anisotropically etching via openings 28A and 28B, a resinous material layer, such as an I-line photoresist, or novolac (novolak) resin optionally including photoactive sensitizer such as diazonapthoquinone, is blanket deposited by a spin-coating process to fill via openings 28A and 28B followed a thermal and/or ultraviolet radiative curing process to initiate further polymeric cross linking reactions and/or to drive off solvents. For example, the thermal curing process is carried out from about 90° C. to about 140° C. and the radiative curing process is carried out with ultraviolet light including wavelengths of less than about 400 nm. A conventional plasma etching chemistry including oxygen is then used to etchback the resinous material layer to form via plugs e.g., 30A and 30B filling at least a portion of via openings e.g., 28A and 28B, for example from about ⅓ to about ¾, more preferably about ½ of the via openings e.g., 28A and 28B. Preferably, the resinous layer is etched back such that the via plugs are formed to fill the vias to a level about where a subsequently formed overlying trench line depth reaches the via plug levels. The via plugs e.g., 30A and 30B, serve to protect via sidewalls during a subsequent trench line etching process and provides an etching endpoint detection means for the trench line etching process.

Figure 1D:
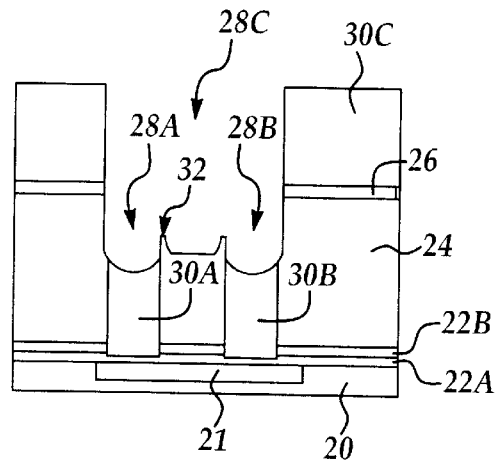

Referring to FIG. 1D, a second conventional photolithographic patterning process is then carried out to pattern a trench line opening etching pattern in photoresist layer 30C overlying and encompassing via openings e.g., 28A and 28B. It will be appreciated that the trench line opening may encompass one or more via openings. According to an aspect of the present invention an RIE process is then carried out to anisotropically etch trench opening 28C overlying and encompassing via openings 28A and 28B including etching through the etch stop/ARC layer 26 and a thickness portion of the IMD layer 24. Preferably, the etching process is carried out including a dual RF power source, for example a dual plasma source (DPS) or an inductively coupled plasma (ICP) where the RF power source is decoupled from a bias generating RF power source. This configuration is preferred to carry out an oxygen/nitrogen plasma treatment according to an aspect of the invention in-situ following the trench etching process.

The trench etching process is carried out in a multi-step plasma etching process including a first plasma etching process to etch through the etch stop/ARC silicon oxynitride layer 26 according to a conventional plasma etch process. In a second plasma etching process according to an aspect of the present invention, the IMD layer 24, preferably a low-k carbon doped silicon oxide according to preferred embodiments, is etched through a thickness to about the level of the via plugs to include etching a portion of the via plugs. Preferably the plasma etch conditions include a plasma source gas mixture of $CF_4$, $N_2$, and Ar including a volumetric ratio $CF_4$ to $N_2$ of about 0.6 to 1 to about 0.9 to 1, more preferably about 0.8 to 1 to make up about a 70 to about 90 volume percent ratio with respect to a plasma source mixture gas volume with a remaining plasma source gas volume made up of an inert gas, preferably argon. For example in a preferred embodiment, the plasma gas source mixture is formed by individually feeding (supplying) plasma source gases to the plasma reactor where $CF_4$ is supplied at a feed rate of about 80 sccm, N2 at about 100 sccm and argon at about 160 sccm. The second plasma etching process is preferably carried out at a pressure of about 60 milliTorr to about 90 milliTorr, more preferably about 80 milliTorr and an RF power of about 750 Watts to about 850 Watts where no RF bias power is supplied to the process wafer backside.

Following the trench etching process, frequently an undesirable via fence e.g., 32 is formed surrounding the via openings at the bottom portion of the trench opening. It has been found that the via fences include an oxide containing material that is resistant to etching believed to be caused by the presence of photoresist residue around the via openings at the bottom portion of the trench level. The plasma etching parameters of the second plasma etching process are an important aspect of the invention since it has been found that the range of preferred embodiments minimizes the formation of a via fence around the via opening at the bottom portion of the trench. Minimizing of the formation of the via fence is an important aspect of the invention with respect to the subsequent oxygen plasma treatment to remove the via fences.

Figure 1E:
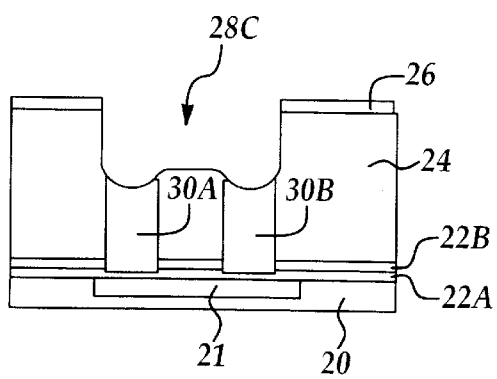

Referring to FIG. 1E, following the second plasma etching process to form the trench opening 28C, an oxygen/nitrogen plasma treatment according to an aspect of the invention is carried out in-situ to remove residues surrounding the via openings at the bottom portion of the trench including via fences e.g., 32 to improve an etching profile. An important feature of this aspect of the invention is that an RF bias power is applied to the process wafer backside during the oxygen/nitrogen plasma treatment. It has been found that the bias power according to preferred embodiments increases the ion bombardment energy to remove the oxide containing fences without damaging via and trench sidewalls. Therefore the plasma operating conditions including the applied RF bias power are important features of the invention.

Preferably the oxygen/nitrogen plasma treatment conditions include a plasma source gas mixture of $N_2$ and $O_2$ including a volumetric ratio $N_2$ to $O_2$ of about 60 to 1 to about 90 to 1, more preferably about 80 to 1 to make up 100 volume percent with respect to a plasma source mixture gas volume. For example in a preferred embodiment, the plasma gas source mixture is formed by individually feeding (supplying) plasma source gases to the plasma reactor where $N_2$ is supplied at a feed rate of about 200 sccm and $O_2$ at about 3 sccm at a total pressure of about 20 milliTorr to about 50 milliTorr, more preferably about 30 milliTorr. The oxygen/nitrogen plasma treatment is preferably carried out at an RF power of about 400 Watts to about 600 Watts, more preferably about 500 Watts where an RF bias power is supplied to the process wafer backside at about 200 Watts to about 300 Watts, more preferably about 250 Watts. The oxygen/nitrogen plasma treatment is preferably carried out for a period of about 10 seconds to about 20 seconds. Specifically, it has been found that helium and argon gases cannot be successfully substituted for nitrogen according to the oxygen/nitrogen plasma treatment to achieve removal of the via fences.

Figure 1F:
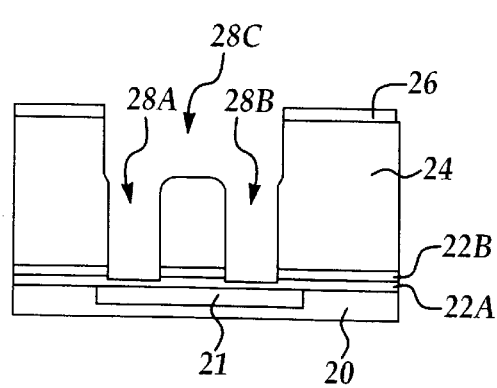

Referring to FIG. 1F, following removal of the via fences e.g., 32 according to the oxygen/nitrogen plasma treatment to improve an etching profile, an oxygen ashing treatment is carried out to remove the via plugs e.g., 30A and 30B. The oxygen ashing treatment preferably is carried out at under plasma operating conditions of about 40 milliTorr to about 50 milliTorr, at an RF power of about 350 Watts to about 450 Watts with no bias power applied to the process wafer backside. A conventional anisotropic etch is then used to etch through a remaining portion of the etch stop layer 22A to reveal the conductive layer 21.

Although not shown, the dual damascene structure is then completed according to conventional processes. For example, the dual damascene opening is filled with metal, for example, copper according to an electrodeposition process followed by a CMP process to remove excess copper above the trench opening to complete the formation of a dual damascene. Prior to electrodeposition of copper, a barrier/adhesion layer of, for example, tantalum nitride, is blanket deposited to line the dual damascene structure, followed by deposition of a copper seed layer to provide an electrodeposition surface. During the subsequent CMP process the process surface is planarized above the trench line opening to complete the formation of the dual damascene structure.

Figure 2:
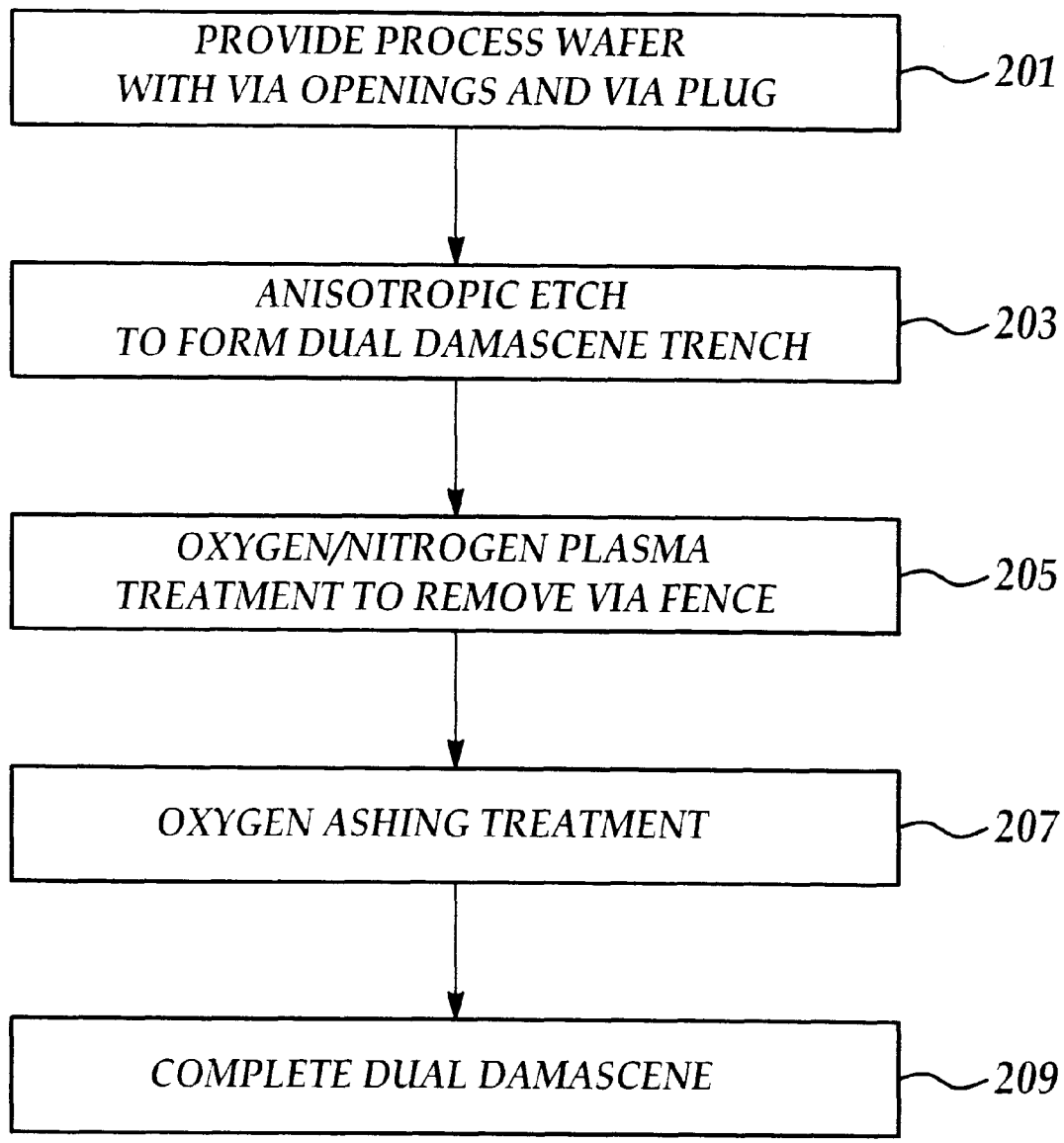
FIG. 2 is a process flow diagram including several embodiments of the present invention.

Referring to FIG. 2 is shown a process flow diagram including several embodiments of the present invention. In process 201, a semiconductor wafer including a process wafer having via openings and via plugs at least partially filling the via openings is provided. In process 203, following a photolithographic patterning process to form a trench line pattern opening overlying and encompassing the via openings a multi-step anisotropic etching process is carried out to etch the trench line to form a dual damascene structure while minimizing via fence formation around via openings. In process 205, an oxygen/nitrogen plasma treatment including an RF bias is carried out to remove the via fences while avoiding dual damascene sidewall damage. In process 207, the via plugs are removed by an oxygen ashing process. In process 209, several conventional processes are carried out to complete the dual damascene including a barrier/adhesion layer deposition step, a metal filling deposition step and a CMP planarization process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for plasma etching a semiconductor feature to improve an etching profile comprising the steps of:
   providing a semiconductor wafer comprising a first feature opening anisotropically etched though a thickness portion of at least one dielectric insulating layer;
   anisotropically etching a second feature opening overlying and at least partially encompassing the first feature opening according to a reactive ion etch (RIE) process to leave an unetched portion surrounding a first feature opening portion at about a bottom portion level of the second feature opening; and,
   plasma treating the first and second openings with a plasma formed of a mixture of oxygen-containing and nitrogen-containing source gases including an applying an independently variable RF bias power source to the semiconductor wafer to remove the unetched portion.

2. The method of claim 1, wherein the at least one dielectric insulating layer comprises one of carbon doped oxide and organo silicate glass having a dielectric constant of less than about 3.2.

3. The method of claim 1, wherein the first feature opening is a via opening the second feature opening is a trench line to comprise a dual damascene structure.

4. The method of claim 1, wherein the unetched portion includes at least one of an oxide and a polymeric material.

5. The method of claim 1, wherein the reactive ion etch process comprises a step for etching through a thickness of the dielectric insulating layer wherein the plasma conditions comprise a plasma source gas mixture of $CF_4$, $N_2$, and Ar wherein a volumetric ratio of $CF_4$ to $N_2$ is about 0.6 to 1 to about 0.9 to 1 to make up about a 70 to about 90 volume percent ratio with respect to a plasma source mixture gas volume with a remaining plasma source gas mixture volume made up of argon.

6. The method of claim 5, wherein plasma conditions further comprise a operating pressure of about 60 milliTorr to about 90 milliTorr, an RF power of about 750 Watts to about 850 Watts where an RF bias power is absent.

7. The method of claim 1, wherein the step of plasma treating comprises plasma operating conditions including a plasma source gas mixture of $N_2$ and $O_2$ having a volumetric ratio of $N_2$ to $O_2$ of about 50 to 1 to about 80 to 1 to make up 100 volume percent with respect to a plasma source mixture gas volume.

8. The method of claim 7, further comprising an operating pressure of about 20 milliTorr to about 50 milliTorr, an RF power of about 400 Watts to about 600 Watts, and an RF bias power at about 200 Watts to about 300 Watts.

9. The method of claim 3, wherein a via plug is formed of polymeric material partially filling the via opening prior to the step of anisotropically etching.

10. The method of claim 9, further comprising the step of carrying an oxygen ashing process following the step of plasma treating to remove the via plug and residual polymeric material from the dual damascene structure.

11. A method for plasma etching a dual damascene structure to improve an etching profile comprising the steps of:
    providing a semiconductor wafer comprising a via opening extending though a thickness portion of at least one dielectric insulating layer;
    anisotropically etching a trench line opening overlying and at least partially encompassing the via opening to forma dual damascene structure according to a reactive ion etch (RIE) process to leave an unetched portion protruding from the via opening portion at about a bottom portion level of the second feature opening; and,
    plasma treating the dual damascene structure with a plasma formed of a mixture of oxygen-containing and nitrogen-containing source gases including an applying an independently variable RF bias power source to the semiconductor wafer to remove the unetched portion without damaging the dual damascene structure sidewalls.

12. The method of claim 11, wherein the at least one dielectric insulating layer comprises one of carbon doped oxide and organo silicate glass having a dielectric constant of less than about 3.2.

13. The method of claim 11, wherein a via plug is formed of polymeric material partially filling the via opening prior to the step of anisotropically etching.

14. The method of claim 11, wherein the unetched portion includes at least one of an oxide and a polymeric material.

15. The method of claim 11, wherein the reactive ion etch process comprises a step for etching through a thickness of the dielectric insulating layer wherein the plasma conditions comprise a plasma source gas mixture of $CF_4$, $N_2$, and Ar wherein a volumetric ratio of $CF_4$ to $N_2$ is about 0.7 to 1 to about 0.9 to 1 to make up about a 70 to about 90 volume percent ratio with respect to a plasma source mixture gas volume with a remaining plasma source mixture gas volume made up of argon.

16. The method of claim 5, wherein plasma conditions further comprise a operating pressure of about 60 milliTorr to about 90 milliTorr, an RF power of about 750 Watts to about 850 Watts where an RF bias power is absent.

17. The method of claim 11, wherein the step of plasma treating comprises plasma operating conditions including a plasma source gas mixture of $N_2$ and $O_2$ having a volumetric ratio of $N_2$ to $O_2$ of about 50 to 1 to about 80 to 1 to make up 100 volume percent with respect to a plasma source mixture gas volume.

18. The method of claim 17, further comprising an operating pressure of about 20 milliTorr to about 50 milliTorr, an RF power of about 400 Watts to about 600 Watts, and an RF bias power at about 200 Watts to about 300 Watts.

19. The method of claim 13, further comprising the step of carrying an oxygen ashing process following the step of plasma treating to remove the via plug and residual polymeric material from the dual damascene structure.

20. The method of claim 11, wherein at least the steps of anisotropically etching and plasma treating are carried out in-situ in a decoupled dual RF power source plasma reactor.

* * * * *